(12) United States Patent
Wilfing

(10) Patent No.: US 10,888,002 B2
(45) Date of Patent: Jan. 5, 2021

(54) COMPONENT CARRIER WITH EMBEDDED TRACKS PROTRUDING UP TO DIFFERENT HEIGHTS

(71) Applicant: AT&S Austria Technologie & Systemtechnik Aktiengesellschaft, Leoben (AT)

(72) Inventor: Roland Wilfing, San Jose, CA (US)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/367,578

(22) Filed: Mar. 28, 2019

(65) Prior Publication Data
US 2020/0315033 A1    Oct. 1, 2020

(51) Int. Cl.
| | |
|---|---|
| *H05K 1/18* | (2006.01) |
| *H05K 3/46* | (2006.01) |
| *H05K 1/09* | (2006.01) |
| *H05K 1/11* | (2006.01) |
| *H05K 3/06* | (2006.01) |
| *H05K 3/10* | (2006.01) |
| *H05K 3/40* | (2006.01) |

(52) U.S. Cl.
CPC ............ *H05K 3/4644* (2013.01); *H05K 1/09* (2013.01); *H05K 1/115* (2013.01); *H05K 1/181* (2013.01); *H05K 1/182* (2013.01); *H05K 3/06* (2013.01); *H05K 3/107* (2013.01); *H05K 3/4038* (2013.01); *H05K 2201/0323* (2013.01); *H05K 2201/0338* (2013.01); *H05K 2201/098* (2013.01); *H05K 2201/09227* (2013.01)

(58) Field of Classification Search
USPC .......................................................... 361/761
See application file for complete search history.

(56) References Cited

U.S. PATENT DOCUMENTS

| | | |
|---|---|---|
| 2004/0173375 A1 | 9/2004 | Lee et al. |
| 2005/0023703 A1 | 2/2005 | Sebesta et al. |
| 2006/0024862 A1 | 2/2006 | Takakusaki et al. |
| 2006/0269770 A1 | 11/2006 | Cox et al. |

(Continued)

FOREIGN PATENT DOCUMENTS

| | | |
|---|---|---|
| CN | 104470234 A | 3/2015 |
| EP | 2496061 A1 | 5/2012 |

OTHER PUBLICATIONS

Tomezak, A.; Extended European Search Report, dated Aug. 7, 2020, 8 pp.; European Patent Office; 80298, Munich, Germany.

*Primary Examiner* — Andargie M Aychillhum
(74) *Attorney, Agent, or Firm* — Robert A. Blaha; Smith Tempel Blaha LLC

(57) ABSTRACT

A component carrier includes a stack having at least one electrically conductive layer structure and/or at least one electrically insulating layer structure, at least one first electrically conductive track extending from a vertical level defined by one of the layer structures up to a first height, at least one second electrically conductive track extending from the vertical level defined by the one of the layer structures up to a second height being larger than the first height, and at least one further electrically insulating layer structure in which the at least one first electrically conductive track and the at least one second electrically conductive track are embedded.

19 Claims, 3 Drawing Sheets

(56) References Cited

U.S. PATENT DOCUMENTS

2013/0207279 A1\* 8/2013 Bouchoucha ......... H01L 21/768
                                                    257/774
2014/0160707 A1   6/2014 Zhang et al.
2015/0034590 A1   2/2015 Takahashi et al.
2017/0170111 A1   7/2017 Reingruber et al.

\* cited by examiner

COMPONENT CARRIER WITH EMBEDDED TRACKS PROTRUDING UP TO DIFFERENT HEIGHTS

TECHNICAL FIELD

The invention relates to a component carrier and to a method of manufacturing a component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. At the same time, component carriers shall be mechanically robust and electrically reliable so as to be operable even under harsh conditions. It is also desirable that component carriers are compatible with the processing of high-frequency signals.

SUMMARY

There may be a need for a simply manufacturable component carrier with extended functionality.

According to an exemplary embodiment of the invention, a component carrier is provided, wherein the component carrier comprises a (in particular laminated) stack comprising at least one electrically conductive layer structure and/or at least one electrically insulating layer structure, at least one first electrically conductive track extending from a vertical level defined by one of the layer structures (in particular extending from a planar surface of an electrically insulating layer structure) up to a first height, at least one second electrically conductive track (being provided separately from the at least one first electrically conductive track) extending from the (i.e. the same) vertical level defined by the one of the layer structures up to a second height being larger than the first height, and at least one further electrically insulating layer structure in which the at least one first electrically conductive track and the at least one second electrically conductive track are embedded.

According to another exemplary embodiment of the invention, a method of manufacturing a component carrier is provided, wherein the method comprises providing (in particular laminating) a stack comprising at least one electrically conductive layer structure and/or at least one electrically insulating layer structure, forming at least one first electrically conductive track extending from a vertical level defined by one of the layer structures up to a first height, forming at least one second electrically conductive track extending from the vertical level defined by the one of the layer structures up to a second height being larger than the first height, and embedding the at least one first electrically conductive track and the at least one second electrically conductive track in at least one further electrically insulating layer structure.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "electrically conductive tracks extending from a vertical level defined by a layer structure" may particularly denote the fact that electrically conductive tracks of different height extend from the same vertical level and therefore have their bottom ends all within one and the same plane. Such a plane may be a horizontal plane in case of a vertical stack of layer structures. In other words, the electrically conductive tracks of different height may all extend from the same bottom level but up to different end levels. An electrically conductive track may extend, in particular exclusively, along a straight or curved trajectory within a horizontal plane of the stack or corresponding to a main surface of one of the layer structures of the stack. A cross-section of the electrically conductive track may for instance be substantially rectangular or substantially trapezoidal. When the electrically conductive track is composed of multiple connected constituents in different adjacent planes or levels, the cross-section of the electrically conductive track may be composed of multiple rectangles or multiple stacked trapezoids.

According to an exemplary embodiment, a component carrier (such as a printed circuit board) may be provided in which one level or plane forms a common basis for electrically conductive tracks of multiple different heights. The electrically conductive tracks may be fully embedded or buried within dielectric material of a corresponding electrically insulating layer structure. Thus, there is a high freedom for a component carrier designer to configure a wiring structure within such a plane making use of two or more differently thick electrically conductive tracks. For instance, electrically conductive tracks of a small height may allow establishing wiring structures for conducting current or signals in any interior layer in a very compact way, for instance in terms of high-density integration. At the same time, it is possible to provide electrically conductive tracks with a larger height for instance for simultaneously establishing high performance tasks, such as providing a low ohmic conductance of high currents, the conductance of high frequency signals and/or the provision of a powerful heat removal of thermal energy generated during operation of the component carrier.

According to an embodiment, it may be possible to form traces extending from the same vertical base level with two or more different thicknesses and formed on the same (electrically conductive or electrically insulating) layer of a component carrier. This may allow overcoming trace length limitations due to component carrier (in particular printed circuit board, PCB) loss (for instance in notebooks, tablets). This may be advantageous in particular for high speed signals, for instance in interface standards (for example 3G, 4G, 5G, USB, TBT, PCIe) using high signal transport speed of for instance above 10 Gbps. Particularly signals with frequencies above 27 GHz, more particularly above 50 GHz, may be processed advantageously with such embodiments. With such an architecture, also significant cross talk improvement may be achieved. It may also be possible to avoid additional component assembly after completion of the component carrier manufacture. In particular, a low-loss and/or high-speed solution may be provided without necessarily using specific low-loss materials. Descriptively speaking, the electrically conductive tracks may be coplanar on a bottom side, and may have different extensions in a vertical direction.

A gist of an exemplary embodiment of the invention is to provide a compact component carrier having lines with different functions and/or for different functions on one layer (e.g. high speed, power supply and normal signal transmission). With such advantageous embodiments, very thin and compact component carriers providing high functionality can be produced.

In the following, further exemplary embodiments of the component carrier and the method will be explained.

In an embodiment, at least one of the at least one first electrically conductive track and/or at least one of the at least one second electrically conductive track has a rectangular or substantially rectangular cross-section. Such a geometry may be particularly advantageous for carrying high-current and/or high-frequency signals.

In an embodiment, at least one of the at least one first electrically conductive track and the at least one second electrically conductive track is a multilevel track of at least two (in particular at least three) stacked track constituents. Correspondingly, the method may comprise forming at least one of the at least one first electrically conductive track and the at least one second electrically conductive track as a multilevel track of at least two stacked track constituents. In order to form the tracks of different height, it is possible to provide the first electrically conductive tracks of lower height for instance from one or two constituents (for instance copper formed during a single plating procedure and a foil), whereas one of the second electrically conductive tracks with higher height can be manufactured by stacking at least two or even at least three individual structures. Such individual structures may for instance be two individual copper layers each formed by a corresponding plating procedure, if desired in combination with a foil. Such a manufacturing concept is simple and allows properly defining different electrically conductive tracks with different properties.

In an embodiment, different ones of the at least two stacked track constituents have different lateral extensions. In this context, a lateral direction may relate to a direction within a horizontal plane of the stack. Correspondingly, the method may comprise forming different ones of the at least two stacked track constituents so as to have different lateral extensions. By not only varying the height of the individual constituents but also their lateral extension, it is possible to form sophisticatedly-stacked constituents with adjustable dimensions in the xy-plane as well as in the z-direction. In other words, electrically conductive tracks formed of two or more stacked constituents may have a different horizontal dimension in the different layers. Additionally or alternatively, it is also possible that different ones of the at least two stacked track constituents are formed with different vertical extensions. However, it is also possible that stacked track constituents have the same vertical and/or lateral extension.

In an embodiment, an upper one of the at least two stacked track constituents has a larger lateral extension than a lower one of the at least two stacked track constituents. Correspondingly, the method may comprise forming an upper one of the at least two stacked track constituents with a larger lateral extension than a lower one of the at least two stacked track constituents. By taking this measure, larger structures may be formed in upper layers but being directly connected to smaller structures in lower layers.

Additionally or alternatively, a vertical extension of an upper one of the at least two stacked track constituents may be larger than a vertical extension of a lower one of the at least two stacked track constituents. It is thus alternatively also possible to combine larger structures in lower layers with smaller structures in higher layers. In particular, the layers mentioned here may be sublayers of one conductive layer in the layer stack of the whole component carrier (in particular PCB).

In an embodiment, a cross-section of the multilevel track has a shape of one of the group consisting of an L-shape, an inverted T-shape, a U-shape, a T-shape, an inverted L-shape, an E-shape, an F-shape, and an S-shape. Examples for such configurations are shown in FIG. 10 to FIG. 16. The mentioned shapes may also be inverted horizontally, i.e. by mirroring the respective shape (for instance an L-shape) on a vertical mirror plane (for instance for obtaining a horizontal inverted L-shape). Additionally or alternatively, the mentioned shapes may also be inverted vertically, i.e. by mirroring the respective shape (for instance an L-shape) on a horizontal mirror plane (for instance for obtaining a vertical inverted L-shape). As an alternative to the mentioned examples, also other geometries are possible.

In an embodiment of the component carrier and the method, the at least one first electrically conductive track and the at least one second electrically conductive track are functionally separated from each other and individually configured so that the at least one first electrically conductive track provides a first function and the at least one second electrically conductive track provides another second function, wherein the first function and the second function are assigned in accordance with the different heights. These functions may be assigned to the electrically conductive tracks by a corresponding hardware configuration of the component carrier, for instance a corresponding circuitry or connection of the electrically conductive tracks, by a coupling of the electrically conductive tracks with one or more embedded and/or surface mounted components, etc. Thus, the first and second electrically conductive tracks may be structurally and functionally separated or decoupled from one another. The different functions of the first and second electrically conductive tracks reflecting their different heights may be different electric functions (for instance different carried currents, different transmitted signal frequencies, etc.), different thermal functions (for instance different amounts of removed heat), etc.

In an embodiment, the at least one second electrically conductive track is configured for—during operation of the component carrier—carrying out at least one task of a group consisting of transmitting a higher current than the at least one first electrically conductive track, transmitting higher-frequency signals than the at least one first electrically conductive track, and removing more heat than the at least one first electrically conductive track. For example, these tasks may be provided by cooperation of the second electrically conductive tracks with one or more components (such as semiconductor chips) embedded in and/or surface mounted on the component carrier. As a result of the higher cross-sectional area, also the capability of the second electrically conductive tracks to carry electric current, remove heat and conduct high-frequency signals with low losses may be improved. Thus, the circuitry of the component carrier may be so that corresponding tasks are fulfilled by the second electrically conductive tracks, whereas the first electrically conductive tracks may be used for less demanding tasks however with low consumption of space.

In an embodiment, the component carrier comprises at least one further electrically conductive layer structure and/or at least one further electrically insulating layer structure connected, in particular laminated, to at least one of the at least one first electrically conductive track and the at least one second electrically conductive track. After having formed the layer(s) with the electrically conductive tracks of different height, it is possible to continue a build-up process by laminating further electrically conductive and/or electrically insulating layer structures on top and/or bottom of the stack. Thereby, even complex component carrier architectures may be manufactured.

In an embodiment, the at least one further electrically insulating layer structure includes resin without reinforcing fibers, in particular without reinforcing structures. When no reinforcing fibres (such as glass fibres) or other reinforcing structures are included in the electrically insulating layer structure(s) above the level with the tracks of different height, trench formation can be simplified. However, it is alternatively also possible that also the mentioned further electrically insulating layer structure(s) include reinforcing particles or structures.

In an embodiment, the at least one electrically insulating layer structure being arranged deeper inside the stack comprises resin with reinforcing structures, in particular with reinforcing fibers. Thus, the electrically conductive tracks of different height may be formed on an electrically insulating layer structure which may even comprise reinforcing structures so as to strengthen the component carrier as a whole. Thus, a proper mechanical reliability can be achieved and warpage may be suppressed.

In an embodiment, the at least one electrically insulating layer structure and the at least one further electrically insulating layer structure are made of the same or from different materials. It can also be that the different dielectric layers of the sublayers may comprise different materials. Use of the same or different materials for the different electrically insulating layer structures involves a further design parameter for fine tuning the properties of the component carrier. For instance, it is also possible to select an appropriate material of an electrically insulating layer structure with the embedded electrically conductive tracks of different heights for adjusting the mechanical properties (in particular in terms of the Young Modulus), the high-frequency properties of the mentioned layer (for instance using a low loss material), etc.

In an embodiment, the method comprises forming a lower one of the track constituents as a patterned electrically conductive layer structure, and subsequently forming an upper one of the track constituents stacked on the lower one of the track constituents as a further patterned electrically conductive layer structure. Forming the individual constituents of a stacked one of the electrically conductive tracks is a simple and straightforward procedure which at the same time allows properly defining the properties of the respective electrically conductive tracks in a simple and precise way.

In an embodiment, the method comprises forming at least one of the patterned electrically conductive layer structures by forming a patterned sacrificial layer structure (in particular a photoresist or dry film), filling at least part of at least one recess of the patterned sacrificial layer structure with electrically conductive material, and subsequently removing the patterned sacrificial layer structure, for instance by stripping. Patterning a deposited or attached sacrificial layer structure may be accomplished photo-lithographically. After exposure using a photomask, undesired portions of the sacrificial layer structure may be removed, for instance by etching. The subsequent filling of the respective recess with electrically conductive material may be simplified by the fact that using an appropriate deposition procedure (for instance galvanic plating) will selectively only deposit electrically conductive material on electrically conductive surfaces, i.e. on exposed surfaces of the electrically conductive layer structure beneath the patterned sacrificial structure, but not on the dielectric sacrificial layer structure itself. The removal of the sacrificial layer structure may be accomplished for instance by stripping, or chemically.

In an embodiment, the method comprises providing (for instance one of the at least one electrically conductive layer structure as) a continuous base layer constituting a bottom portion of the at least one first electrically conductive track and/or the at least one second electrically conductive track. For instance, the continuous base layer may be a copper foil attached to a surface of the stack. Alternatively, the continuous base layer may also be formed by electroless deposition, ALD (atomic layer deposition) or PVD (physical vapor deposition) like sputtering. It may define an electrically conductive base on which further electrically conductive material may be selectively deposited for forming the first and/or second electrically conductive tracks of different height. During the manufacturing process, the continuous base layer may connect individual ones or pre-forms of the first electrically conductive tracks and/or the second electrically conductive tracks. As will be described below, material of the base layer may then be removed for separating the electrically conductive tracks.

In a further embodiment, the base or seed layer may be applied in a structured way (more specifically in terms of an additive process).

In an embodiment, the method comprises forming the at least one first electrically conductive track by forming the continuous base layer (in particular by electroless deposition, ALD or PVD like sputtering or by lamination of an electrically conductive foil), forming a patterned sacrificial layer having at least one recess on the continuous base layer exposing at least one portion of the continuous base layer, and filling electrically conductive material selectively in the at least one recess and on the continuous base layer, in particular by plating, or by using a conductive paste, to thereby obtain the at least one first electrically conductive track. The mentioned procedure is simple and straightforward and nevertheless allows freely defining the first electrically conductive tracks in terms of lateral dimensions and in terms of vertical dimensions.

In an embodiment, the method comprises forming a patterned further sacrificial layer on the at least one first electrically conductive track and on the continuous base layer and having at least one recess exposing at least one further portion of the continuous base layer, in particular not exposing the at least one first electrically conductive track. Thus, forming the second electrically conductive tracks may be carried out by continuing a procedure already implemented for forming the first electrically conductive tracks.

In an embodiment, the method further comprises filling the at least one further recess with further electrically conductive material on the continuous base layer, in particular by plating, to thereby form the at least one second electrically conductive track. Such a selective deposition of electrically conductive material can be supported by the fact that a certain deposition procedure (in particular galvanic plating) will result in the formation of electrically conductive material (such as plated copper) only on electrically conductive surface portions, i.e. on the exposed portion(s) of the base layer, but not on dielectric portions of the sacrificial layer structure. Thereby, the precise position and properties of the various electrically conductive tracks may be precisely defined.

In an embodiment, it is possible that each of the sublayers comprises different compositions of conductive material to achieve the functional task of each line. For instance, it may be advantageous to use conductive pastes for this purpose.

In an embodiment, the method comprises removing the further sacrificial structure after the filling. Such a removal may be accomplished for instance by stripping or chemically.

In an embodiment, the method comprises, after removing the further sacrificial layer structure, removing exposed material of the base layer to thereby separate the at least one first electrically conductive track from the at least one second electrically conductive track from one another (in particular by flash etching). Thus, the base layer having functioned previously as a continuous electrically conductive base for depositing material for forming constituents of the electrically conductive tracks, it may be separated after completing formation of the electrically conductive tracks by back etching to separate the tracks electrically and mechanically. Such a separation may for instance be carried out very simple by back etching copper material which removes a thin surface layer of the entire exposed surface, including complete removal of the base layer between the thicker manufactured electrically conductive tracks.

In an embodiment, the method comprises repeating the process flow according to the previous description a number n (wherein n=1, 2, 3, ... ) of times for obtaining electrically conductive tracks of n+2 different heights (i.e. one additional height per repetition of the process flow). In the above description, one level has been described at which electrically conductive tracks of different heights can be formed. However, the described procedure of forming at least two different heights of electrically conductive tracks beginning at the same vertical bottom level but extending up to different vertical end levels may be continued once, two times, or any desired larger number of times n in further levels. In other words, two or more electrically conductive heights of electrically conductive tracks may be formed in subsequent stages of the manufacturing procedure, but based on the same vertical level. It is also possible to form additional tracks of different height in upper or lower levels. Thus, even sophisticated electric connections and thermal spreading architectures may be manufactured with low effort in the described way.

In an embodiment, the method comprises forming the at least one first electrically conductive track and a part of the at least one second electrically conductive track simultaneously. In other words, material forming the first electrically conductive tracks and the second electrically conductive tracks may be applied partially simultaneously. This renders the manufacturing process quick and efficient and executable on an industrial scale.

In an embodiment, at least one of the at least one first electrically conductive track and/or at least one of the at least one second electrically conductive track has a roughness (in particular a roughness Rz and/or Ra) on a horizontal surface portion, in particular on a top surface portion, being different from, in particular being higher than, a roughness on a side surface portion of the respective track. The roughness of a surface may be defined as and may be measured as the centerline average height Ra. Ra is the arithmetic mean value of all distances of the profile from the centerline. The roughness of a surface may however also be defined as and may be measured as average roughness depth Rz. Rz can be determined when a reference length is sampled from a roughness curve in a direction of a mean line, and may denote the distance between the top profile peak line and the bottom profile valley line on this sampled portion as measured in the longitudinal direction of the roughness curve (for instance, Rz may be determined by averaging over five individual measuring paths). For instance, the measurement or determination of roughness Ra and Rz may be carried out according to DIN EN ISO 4287:2010. It may be in particular advantageous when the roughness on a top surface is higher than a roughness on the side surfaces or side walls, because this may promote proper adhesion between the respective electrically conductive track and the other layer structures. As a result, the obtained component carrier may show a reduced tendency of delamination. Roughness may be adjusted by selecting specific materials (for instance providing a copper foil with a certain surface roughness), by a treatment of a structure (for instance by a plasma treatment or a mechanical treatment), and/or by correspondingly adapting a process of forming the respective structure (for instance by correspondingly adjusting a plating process).

In an embodiment, at least one of the at least one second electrically conductive track has an aspect ratio of larger than one. In this context, the term "aspect ratio" may particularly denote a ratio between the second height and a lateral diameter of the respective second electrically conductive track. This allows manufacturing second electrically conductive tracks being highly appropriate for high frequency applications and being capable of carrying a high current.

In an embodiment, a ratio between the second height and the first height may be at least 1.5, in particular at least 2, more particularly between 2 and 4. For instance, the ratio may be in a range between 2 and 3 or in a range between 3 and 4.

In an embodiment, the first height is in a range between 5 μm and 40 μm, in particular in a range between 5 μm and 25 μm, more particularly in a range between 10 μm and 20 μm. Correspondingly, the second height may be in a range between 10 μm and 160 μm, in particular in a range between 25 μm and 80 μm, more particularly in a range between 35 μm and 70 μm. However, the second height should be larger than the first height.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier also ensures short electric connection paths, and therefore suppresses signal distortion during transport.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzo cyclobutene.

In an embodiment, each of the above mentioned electrically insulating layer structures comprises at least one of the group consisting of resin (such as reinforced or non-reinforced resins, for instance epoxy resin or Bismaleimide-Triazine resin), cyanate ester, polyphenylene derivate, glass (in particular glass fibers or spheres, multi-layer glass, glass-like materials), prepreg material (such as FR-4 or FR-5), polyimide, polyamide, liquid crystal polymer (LCP), epoxy-based Build-Up Film, polytetrafluoroethylene (Teflon), a ceramic, and a metal oxide. Teflon® is a registered trademark of the Chemours Company FC, LLC of Wilmington Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectrics may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, each of the above mentioned electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier further comprises an electronic component mounted on and/or embedded in the component carrier material, in particular in the stack. For instance, the electronic component may be a radiofrequency semiconductor chip configured for emitting and/or receiving radiofrequency signals via the wiring structures and being electrically coupled with the electrically conductive wiring structures. In particular in this case it may be advantageous that the electronic component is in the same layer as the structure with different heights. Hence, the electronic component may be configured for executing a radio frequency application, in particular a radio frequency application involving frequencies above 1 GHz.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

DETAILED DESCRIPTION OF ILLUSTRATED EMBODIMENTS

Figure 1:
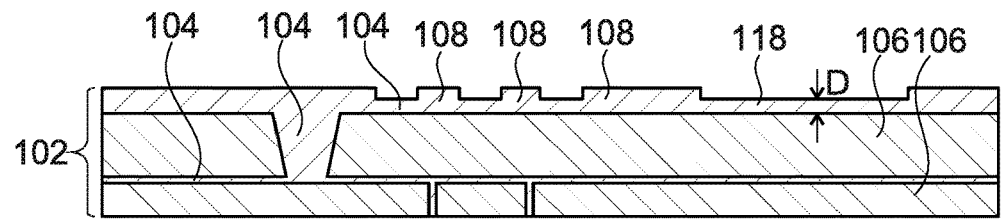
FIG. 1, FIG. 2, FIG. 3, FIG. 4, FIG. 5 and FIG. 6 illustrate cross-sectional views of structures obtained during performance of a method of manufacturing a component carrier with electrically conductive tracks of different height extending from the same plane.

The aspects defined above and further aspects of the invention are apparent from the examples of embodiment to be described hereinafter and are explained with reference to these examples of embodiment.

The invention is described in more detail hereinafter with reference to examples of embodiment but to which the invention is not limited.

The illustrations in the drawings are schematically presented. In different drawings, similar or identical elements or features are provided with the same reference signs.

Before referring to the drawings, exemplary embodiments will be described in further detail, some basic considerations will be summarized based on which exemplary embodiments of the invention have been developed.

Conventionally, expensive low k or low dk materials (i.e. a material having a small relative dielectric constant) are used to cater for high speed interface requirements, in particular above 10 Gbps. In such approaches, additional component assembly is in many cases needed. Furthermore, routing length limitations may occur due to additional loss in case of high-speed interface requirements, or for high-speed differentials.

In order to at least partially overcome these and/or other shortcomings, a component carrier manufacturing architecture according to an exemplary embodiment of the invention may be provided involving the opportunity to provide traces of different height in the same layer of a stack, More specifically, embodiments may involve PCB trench structuring using a two-stage (or multiple stage) semi additive process (SAP) or modified semi additive process (mSAP) or additive process (AP), in particular for establishing high speed lines (compare FIG. 1 to FIG. 7). It may hence be possible to establish a manufacturing process using a two- (or more) stage SAP, mSAP or AP to create two (or more) different thicknesses for traces or trenches. This may be provided in terms of a low-cost concept achieving flexibility through a design process and not (or not only) by material selection. Embodiments may thus provide a high-speed interconnect solution using process technology to avoid or reduce signal loss. In particular, such a solution may avoid using various low loss materials. An architecture according to exemplary embodiments addresses a solution for high signal speeds, latency, signal integrity and fits with many applications, such as notebooks, tablets, phones, 2in1 devices, 5G devices and high frequency applications.

Thus, a low loss solution compared to existing computing systems may be provided, for example for notebook platforms requesting high speed signal routing (for example above 10 Gbps) or for any other application requesting high speed PCB solutions. In particular, any application is possible related with higher speed interfaces (3G, 4G, 5G, USB, TBT, PCIe), in particular when a high transmission speed of 10 Gbps for more is required or desired. Particularly signals with frequencies above 27 GHz, more particularly above 50 GHz, may be processed advantageously with such embodiments.

Figure 5:
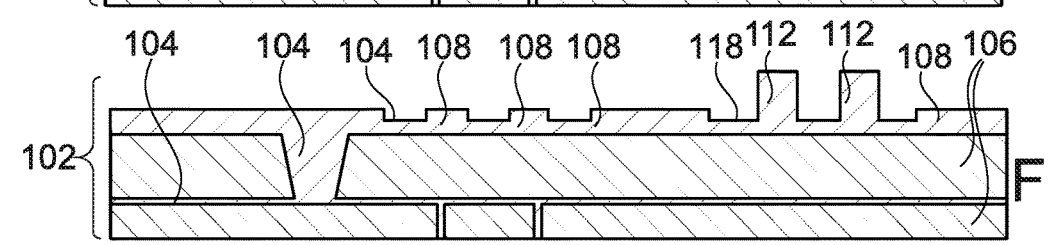
Figure 6:
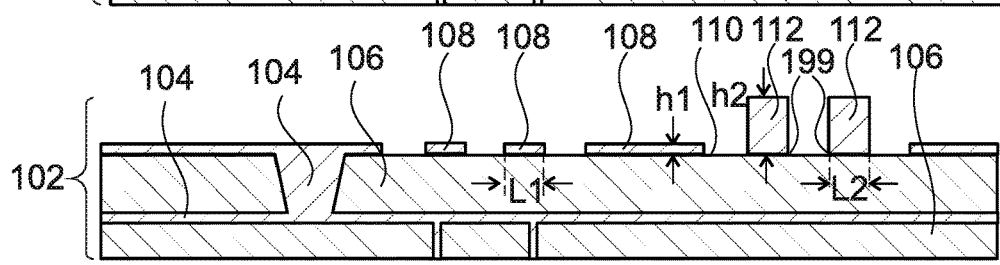
Figure 7:
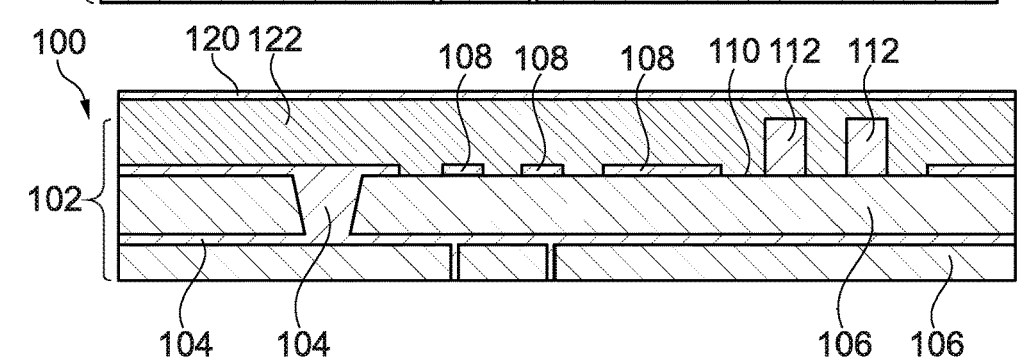
FIG. 7 illustrates a cross-sectional view of a component carrier with electrically conductive tracks of different height manufactured with a method illustrated in FIG. 1 through FIG. 6.

FIG. 1 to FIG. 7 illustrate cross-sectional views of structures obtained during carrying out a method of manufacturing a component carrier 100 according to an exemplary embodiment of the invention, shown in FIG. 7. More specifically, FIG. 1 to FIG. 7 illustrate a manufacturing architecture with PCB trench formation implementing a two-stage semi additive processing (SAP) or modified semi additive processing (mSAP) process flow. Also, additive processing (AP) is possible in an embodiment.

Referring to FIG. 1, a laminated stack 102 is formed which is composed of electrically conductive layer structures 104 and electrically insulating layer structures 106. The electrically insulating layer structures 106 shown in FIG. 1 can comprise a resin, such as an epoxy resin, optionally including reinforcing structures such as glass spheres or glass fibres. The electrically conductive layer structures 104 may be copper structures, for instance continuous and/or patterned copper foils. The electrically conductive layer structures 104 may also comprise vertical through connections such as copper filled vias. The mentioned copper structures may be formed by electroless deposition or sputtering or by galvanic plating.

The component carrier 100 to be manufactured can be a laminated plate-type printed circuit board (PCB) or an IC (integrated circuit) substrate.

Pre-forms of first electrically conductive tracks 108 are formed on a top main surface of stack 102, and all extend from a common vertical level defined by an upper main surface of an upper one of the electrically insulating layer structures 106.

As shown, the uppermost portion of the electrically conductive layer structures 104 is constituted by a continuous base layer 118 covering the entire electrically insulating layer structure 106. For example, the continuous base layer 118 may be a copper foil or a layer of electroless deposited or sputtered copper, from which the pre-forms of the first electrically conductive tracks 108 extends upwardly. For instance, the base layer 118 may have a thickness, D, in a range between 0.01 μm and 8 μm, for example in a range between 1 μm and 3 μm.

Although not shown in FIG. 1, the uppermost portion of the electrically conductive layer structures 104 may be formed by firstly forming said continuous base layer 118, for example by electroless deposition or sputtering, ALD or PVD like sputtering, or by attaching the continuous base layer 118 as thin copper foil to the other layer structures 104, 106 of the layer stack 102 shown in FIG. 1. Thereafter, a patterned sacrificial layer (not shown) may be formed on said base layer 118 exposing multiple portions of the continuous base layer 118. Each of these portions defines a respective surface region in which a pre-form of the first electrically conductive tracks 108 is to be formed. Further subsequently, the method may comprise filling electrically conductive material, such as plated copper, selectively in recesses of the patterned sacrificial layer and thus on the base layer 118, in particular by plating, to thereby form the pre-forms of the first electrically conductive tracks 108 shown in FIG. 1. Thus, a first SAP or mSAP process may be carried out. The sacrificial layer structure may then be removed.

FIG. 1 thus shows a structure in which the surface is formed with a surface profile having elevated portions forming pre-forms of first electrically conductive tracks 108 and having portions of a connecting base layer 118 in between. The base layer 118 may be formed on the entire main surface of the beneath electrically insulating layer structure 106, and also partially on a beneath electrically conductive layer structure 104.

Figure 2:
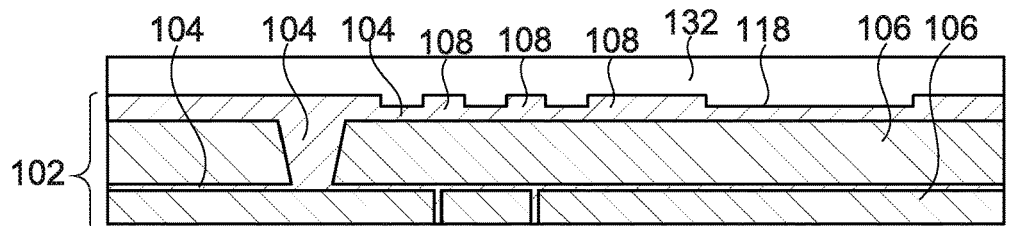

Referring to FIG. 2, a further sacrificial layer structure 132 may be formed, applied or attached to an upper main surface of the structure shown in FIG. 1. For example, the further sacrificial layer structure 132 may be a photoresist or dry film. More specifically, a liquid photoresist or a dry film may be applied, and a pre-cleaning procedure may be carried out.

The shown pre-forms of first electrically conductive tracks 108 as well as the continuous base layer 118 may be covered by the further sacrificial layer structure 132. Thus, according to FIG. 2, the entire upper main surface of the structure shown in FIG. 1 may be covered with the further sacrificial layer structure 132.

Figure 3:
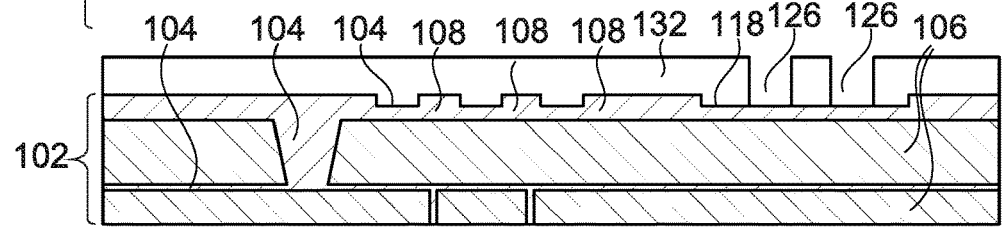

Referring to FIG. 3, the further sacrificial layer structure 132 may be patterned in accordance with a desired pattern of second electrically conductive tracks 112 to be formed. This patterning procedure can be carried out by exposing and developing the photoresist-type further sacrificial layer structure 132. Proper registration during this procedure is advantageous. While the patterned further sacrificial layer structure 132 may cover portions of the base layer 118 and the entire pre-forms of the first electrically conductive tracks 108, the patterned further sacrificial layer structure 132 may expose other portions of the continuous base layer 118 in which the second electrically conductive tracks 112 are to be formed. The exposed portions may correspond to recesses 126 in the patterned further sacrificial layer structure 132.

Hence, the further sacrificial layer structure 132 is patterned to selectively expose regions of the base layer 118 on which copper material can be subsequently deposited galvanically to form the second electrically conductive tracks 112. Although not shown, the patterning of the further sacrificial layer structure 132 may be accomplished using a mask for selectively illuminating only specific portions of the upper surface of the further sacrificial layer structure 132 with electromagnetic radiation such as UV light or visible light. Thereafter, the illuminated portions (or the non-illuminated portions, depending on the material of the further sacrificial layer structure 132) may be selectively removed, for instance by etching.

Figure 4:
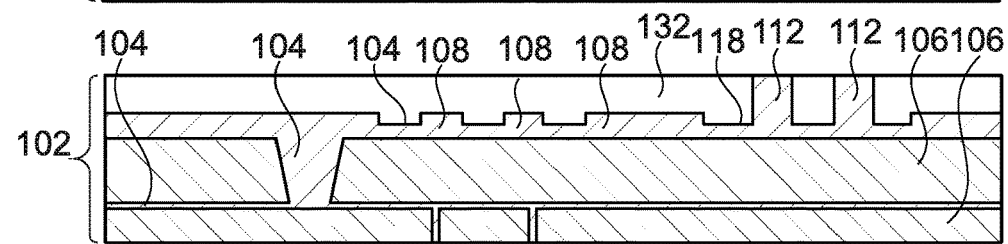

Referring to FIG. 4, pre-forms of the second electrically conductive tracks 112 may be formed selectively and exclusively in the recesses 126 and thus on exposed portions of the continuous base layer 118. This can be accomplished by filling each of the recesses 126 of the patterned further sacrificial layer structure 124 partially or entirely with electrically conductive material, for instance by galvanic copper plating. Thus, the exposed portions of the continuous base layer 118 may be covered by plating with copper to thereby continue formation of the second electrically conductive tracks 112. FIG. 4 therefore illustrates a further manufacturing stage, in which plating of the previously formed trenches or recesses 126 is carried out. Said further manufacturing stage may be denoted as a second step of the mSAP, or may be an SAP process or an additive process on a not finished (m)SAP process. By carrying out a galvanic plating procedure with the structure shown in FIG. 3, only deposition of copper material on exposed surface portions of the base layer 118 occurs. By taking this measure, the pre-forms of the second electrically conductive tracks 112 may be formed.

For instance, the pre-forms of the second electrically conductive tracks 112 may have a thickness being three times to four times of the thickness of the pre-forms of the first electrically conductive tracks 108.

Although not shown, it is also possible referring to the structure shown in FIG. 4 to form a further constituent of the second electrically conductive tracks 112 having a larger or smaller lateral extension than the shown second electrically conductive tracks 112. By taking this measure, structures as shown in FIG. 10 to FIG. 16 may be formed. Also not shown as well, a corresponding procedure according to FIG. 10 to FIG. 16 may also be applied to the first electrically conductive tracks 108.

Referring to FIG. 5, the patterned further sacrificial layer structure 132 may be subsequently removed after the copper plating procedure described referring to FIG. 4. Thus, the patterned photoresist or dry film may be removed after copper plating. FIG. 5 thus shows a structure of FIG. 4 after removing the patterned further sacrificial layer structure 132, for instance by stripping.

In order to form further electrically conductive tracks (not shown) with yet another vertical thickness within the same layer and starting from the same bottom as the first and second electrically conductive tracks 108, 112, the process flow according to FIG. 2 to FIG. 4 can be repeated once or multiple times based on the structure shown in FIG. 5. More generally, the repetition may be made a number n of times for obtaining electrically conductive tracks 108, 112, . . . of n+2 different heights h1, h2, . . . (compare FIG. 6). For instance, if n=1, electrically conductive tracks of three different heights may be obtained, and so on. If desired, the procedure described referring to FIG. 2 to FIG. 4 can thus be repeated once or multiple times in order to form further electrically conductive tracks with yet another height, i.e. with a height different from h1 and h2. Thus, even more than two different heights of electrically conductive tracks may be formed by taking this measure.

Referring to FIG. 6, the method comprises—after the removal of the patterned further sacrificial layer structure 132—removing exposed material of the base layer 118 in between the pre-forms of the electrically conductive tracks 108, 112 to thereby separate the first electrically conductive tracks 108 and the second electrically conductive tracks 112 from one another by flash etching. Simultaneously with this separation, formation of the electrically conductive tracks 108, 112 is completed.

As mentioned above, the continuous base layer 118 may be preferably a copper foil. In contrast to this, the electrically conductive material provided on top of the continuous base layer 118 may be plated copper. Thus, the copper configuration of the continuous base layer 118 and the additional electrically conductive material of the preforms of the electrically conductive tracks 108, 112 on top of the continuous base layer 118 may be different. As a consequence of this, removing exposed material of the continuous base layer 118 and a corresponding surface portion of the additional electrically conductive material provided on top of portions of the continuous base layer 118 may generate an undercut 199 at a bottom portion of the second electrically conductive tracks 112, and optionally also at a bottom portion of the first electrically conductive tracks 108. In this context, the term "bottom portion" may denote the portion of the respective track 112, 108 at the interface to electrically insulating layer structure 106 directly below. This formation of an undercut 199 may be the result of an etching procedure removing copper material of the foil-type continuous base layer 118 more efficiently than removing copper material of the plated electrically conductive material above. In other words, the mentioned undercut 199 may be a fingerprint of the described modified semi-additive processing (mSAP).

As can be taken from FIG. 6, the vertical thickness, h2, of the second electrically conductive tracks 112 may for instance be three to four times of the vertical thickness, h1, of the first electrically conductive tracks 108. For instance, the vertical thickness or first height, h1, of the first electrically conductive tracks may be 10 μm to 20 μm, whereas the vertical thickness or second height, h2, of the second electrically conductive tracks 112 may be in a range between 45 μm and 60 μm. By taking this measure, the signal transport properties and/or heat removal properties and high frequency capability of the second electrically conductive tracks 112 may be selectively strengthened.

For instance, a maximum lateral extension, L1, of a respective one of the first electrically conductive traces 108 is larger than the first height, h1, for instance at least three times of the first height h1. It is also possible that a maximum lateral extension, L2, of a respective one of the second electrically conductive traces 112 is about the same as the second height, h2. It is however also possible that the aspect ratio of a respective second electrically conductive track 112 (i.e. the ratio between h2 and L2) is larger than one.

Etching, for instance flash etching, can be carried out to obtain the structure shown in FIG. 6 based on the structure shown in FIG. 5. By taking this measure, it is for instance possible to precisely define that 3 μm thick copper material shall be removed from the entire exposed upper main surface of the structure shown in FIG. 5. By taking this measure, the thin exposed portions of the base layer 118 may be removed, while maintaining the material of the readily manufactured the electrically conductive tracks 108, 112. Furthermore, the individual electrically conductive tracks 108, 112 can be separated by the mentioned flash etching procedure.

Referring to FIG. 7, a further build-up can be carried out. In the present embodiment, a further electrically insulating layer structure 122 and a further electrically conductive layer structure 120 may be laminated on top of the structure shown in FIG. 6.

Hence, FIG. 7 shows a readily manufactured component carrier 100 according to an exemplary embodiment of the invention. The component carrier 100 is composed of the stack 102 of electrically conductive layer structures 104 and electrically insulating layer structures 106, of the first electrically conductive tracks 108 extending from a vertical level 110 defined by an upper main surface of the central electrically insulating layer structure 106 up to first height, h1, of for instance 15 μm, and of the second electrically conductive tracks 112 extending from the vertical level 110 defined by the central one of the electrically insulating layer structures 106 up to second height, h2, of for instance 50 μm, i.e. being larger than the first height, h1.

In view of its significantly larger vertical thickness, h2, the second electrically conductive tracks 112 may be configured for, during operation of the component carrier 100, transmitting a high current, transmitting high frequency signals (for instance above 1 GHz), and/or removing heat during operation of the component carrier 100 (for instance generated from a component, such as a microcontroller, embedded in or surface mounted on the component carrier 100, not shown).

The component carrier 100 furthermore comprises further electrically conductive layer structure 120 and further electrically insulating layer structure 122 laminated to the other layer structures 104, 106 of the stack 102. Preferably, the further electrically insulating layer structure 122 comprises resin without reinforcing structures. In contrast to this, the other electrically insulating layer structures 106 may comprise resin with reinforcing structures. Thus, the electrically insulating layer structures 106 and the further electrically insulating layer structure 122 may be made of different materials for fine-tuning the properties of the component carrier 100. Hence, during the build-up process, the structure shown in FIG. 6 may be provided on a top main surface with a resin sheet, while glass reinforced material may be avoided in further electrically insulating layer structure 122 due to the presence of the trenches. In particular, it may be possible with the component carrier 100 to obtain a low loss and/or high-speed component carrier (in particular printed circuit board or IC substrate) without the need to implement costly low loss materials. For example, the component carrier 100 shown in FIG. 7 may be used for notebook platforms involving high speed signal routing (in particular above 10 Gbps).

The plate-shaped laminated PCB type component carrier 100 shown in FIG. 7 can thus be obtained by continuing the build-up by the lamination of further layer structures 122, 120. Although the use of glass fibre-free resin material for the further electrically insulating layer structure 122 may be preferred, it is alternatively also possible to use a resin mixed with reinforcing structures, such as prepreg, for the further electrically insulating layer structure 122.

Figure 8:
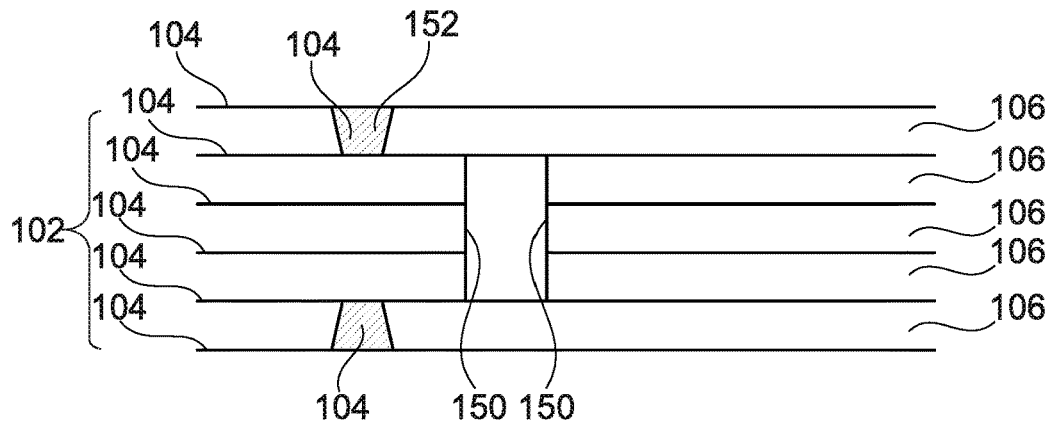
FIG. 8 illustrates a pre-form of a component carrier with electrically conductive tracks of different height according to an exemplary embodiment of the invention.

FIG. 8 illustrates a pre-form of a component carrier 100 with electrically conductive wiring structures according to an exemplary embodiment of the invention. The pre-form, shown in FIG. 8, of a component carrier 100 is based on a PCB track or trench formation on an 8-layer HDI (high density integration) architecture. Four layers may be formed on the basis of the subtractive process. In order to complete a six-layer architecture, a core and prepreg may be added. Also, a second press cycle may be carried out with an mSAP copper carrier.

Figure 9:
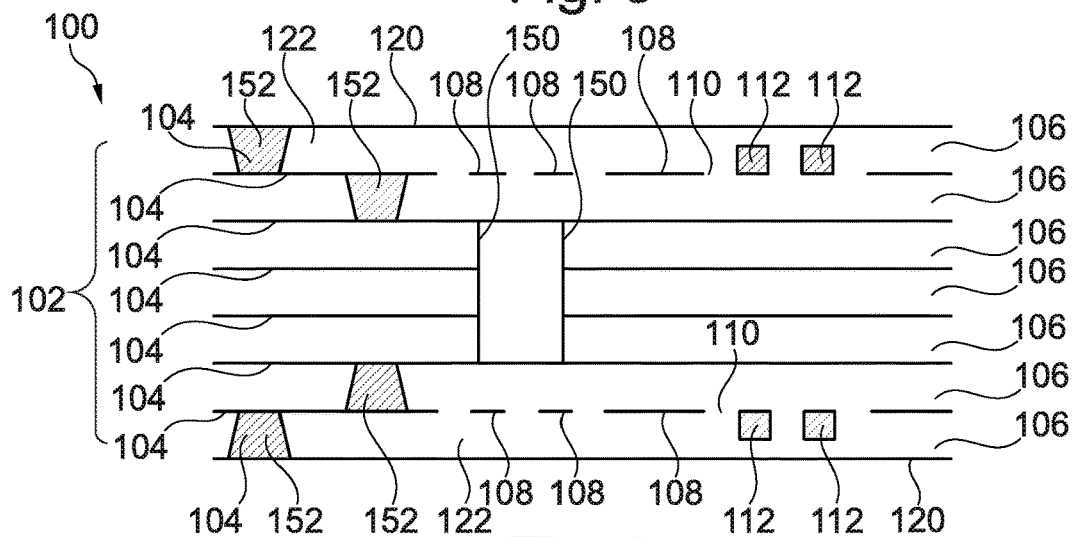
FIG. 9 illustrates a component carrier formed on the basis of the pre-form shown in FIG. 8 and having electrically conductive tracks of different height on both opposing main surfaces of a stack forming an interior portion of the component carrier.

FIG. 9 illustrates component carrier 100 formed on the basis of the pre-form shown in FIG. 8.

What concerns the second layer and the seventh layer number, a two-stage step mSAP (or SAP) process may be carried out. In a first stage of the (m)SAP process, it may be possible to create a pre-form of first electrically conductive traces or tracks 108 (but preferably no flash etching is carried out). In a second stage of the (m)SAP process, it is possible to create trenches, as a basis for the second electrically conductive traces or tracks 112. Subsequently, an etching procedure may be carried out. A build-up process may be continued with the addition of a resin sheet, to thereby connect further electrically insulating layer structures 122. For the first electrically conductive traces or tracks 108, 15 µm thick copper structures may be formed. For the high-speed traces in form of the second electrically conductive tracks 112, 45 µm to 60 µm thick copper structures may be formed.

FIG. 8 shows a pre-form of component carrier 100 with six metallic layers laminated together. A vertical through-connection 150 is shown as well. Also, copper-filled laser vias 152 are shown. The component carrier 100 according to FIG. 9 can be obtained by laminating on both opposing main surfaces of the structure shown in FIG. 8 further electrically conductive layer structures 120 and further electrically insulating layer structures 122 after formation of first electrically conductive tracks 108 and second electrically conductive tracks 112 on both opposing main surfaces. For instance, the further electrically insulating layer structures 122 may be pure resin sheets. The first electrically conductive tracks 108 may be traces having a copper height of for instance 15 µm. The second electrically conductive tracks 112 may be high-speed trenches with a copper thickness in a vertical direction of for instance 45 µm to 60 µm. As can be taken from FIG. 9 as well, a plurality of first electrically conductive tracks 108 and a plurality of second electrically conductive tracks 112 having the above-described features are formed on both opposing main surfaces of the stack 102.

FIG. 10 to FIG. 16 illustrate cross-sectional views of pre-forms of component carriers 100 (FIG. 10, FIG. 11) and of component carriers 100 (FIG. 12 to FIG. 16) with multilevel tracks 108, 112 having track constituents 114, 116 of different lateral extensions I1, I2 and having different vertical extensions d1, d2 in different levels according to exemplary embodiments of the invention. With such a concept and as shown in FIG. 10 to FIG. 16, various different cross-sections of the multilevel tracks 108, 112 may be formed.

Figure 10:
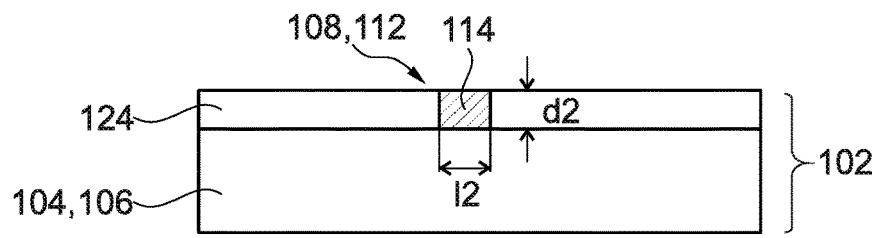
FIG. 10 and FIG. 11 illustrate pre-forms of a component carrier with multilevel tracks having different lateral extensions in different levels according to an exemplary embodiment of the invention.

Referring to FIG. 10, the method comprises forming a patterned electrically conductive layer structure to thereby form a lower one of the electrically conductive track constituents 114, 116, i.e. track constituent 114. Track constituent 114 has a lateral extension, I2, and a height, d2. Track constituent 114 is formed by depositing electrically conductive material after having formed and patterned a sacrificial layer structure 124 on an electrically insulating layer structure 106 and/or on an electrically conductive layer structure 104 beneath.

Figure 11:
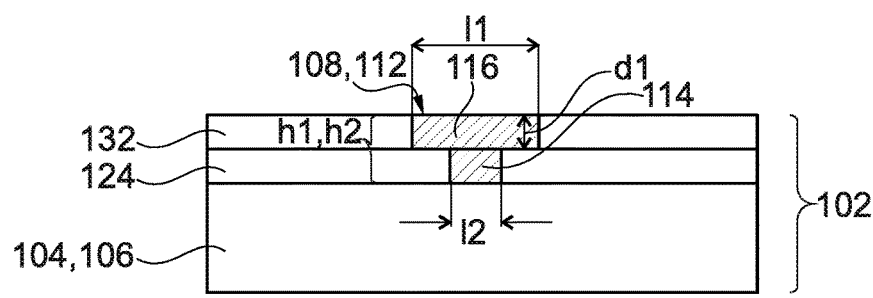

Referring to FIG. 11, it is possible to subsequently form an upper patterned electrically conductive layer structure to thereby form upper track constituent 116 stacked on the lower track constituent 114. Track constituent 116 has a lateral extension I1>I2 and a height d1. Track constituent 116 is formed by depositing electrically conductive material after having formed and patterned a further sacrificial layer structure 132 on the patterned sacrificial layer structure 124 beneath.

Hence, the first electrically conductive tracks 108 and/or the second electrically conductive tracks 112 may be formed as a multilevel track(s) of two or more stacked track constituents 114, 116.

Still referring to FIG. 10 and FIG. 11, by the subsequent deposition and patterning of a respective sacrificial layer structure 124, 132 (such as a dry film or photoresist), the different constituents 114, 116 (wherein one or more further vertical constituents are possible above constituent 116) may be precisely defined in terms of height d1, d2 and lateral extension I1, I2. After removal of the respective sacrificial layer structures 124, 132, for instance by stripping or chemically, a substantially T-shaped electrically conductive track 110 or 112 can be obtained in the example shown in FIG. 11.

Figure 12:
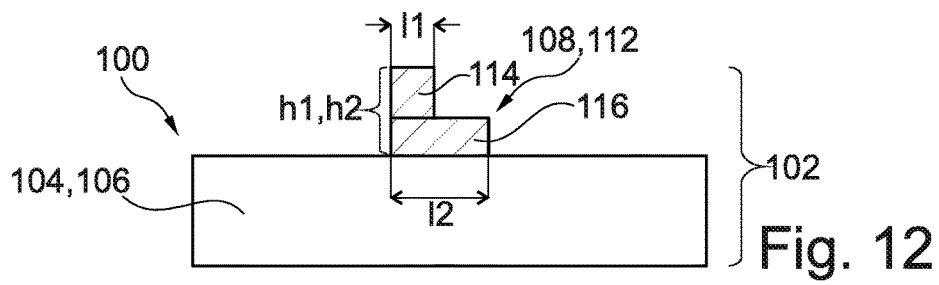
FIG. 12, FIG. 13, FIG. 14, FIG. 15 and FIG. 16 illustrate component carriers with multilevel tracks having different lateral extensions in different levels according to exemplary embodiments of the invention.

According to FIG. 12, a substantially L-shaped multilevel track 108, 112 can be formed with the manufacturing procedure corresponding to FIG. 10 and FIG. 11, however with different values of I1, I2.

Figure 13:
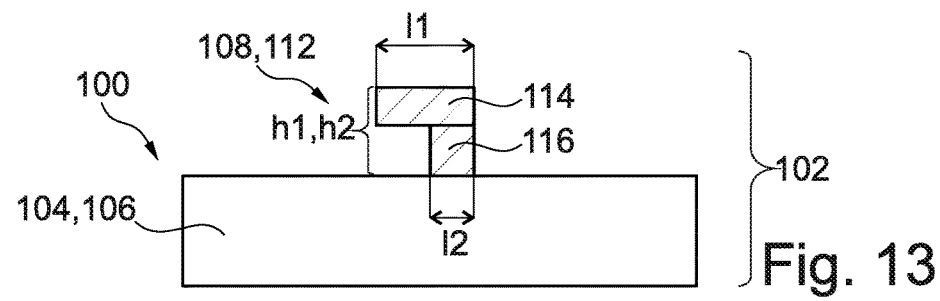

According to FIG. 13, a horizontally and vertically inverted L-shaped track 108, 112 can be formed, i.e. a shape of the respective track 108, 112 obtained by mirroring the L-shape according to FIG. 12 on a horizontal mirror plane and on a vertical mirror plane (not shown).

Figure 14:
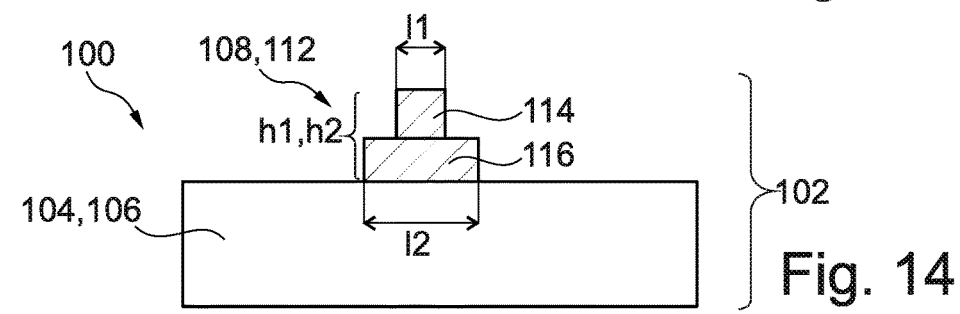

According to FIG. 14, an inverted T-shaped track 108, 112 can be obtained, i.e. a shape of the respective track 108, 112 obtained by mirroring the T-shape according to FIG. 11 on a horizontal mirror plane (not shown).

Figure 15:
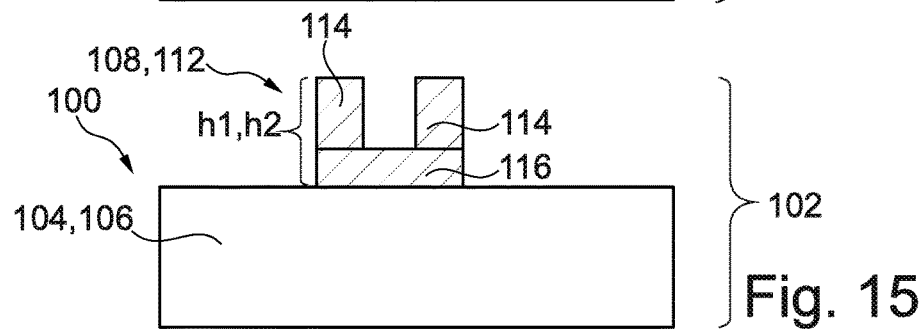

According to FIG. 15, a substantially U-shaped track 108, 112 can be formed, combining one structure of track constituent 116 with two separate structures of track constituent 114.

Figure 16:
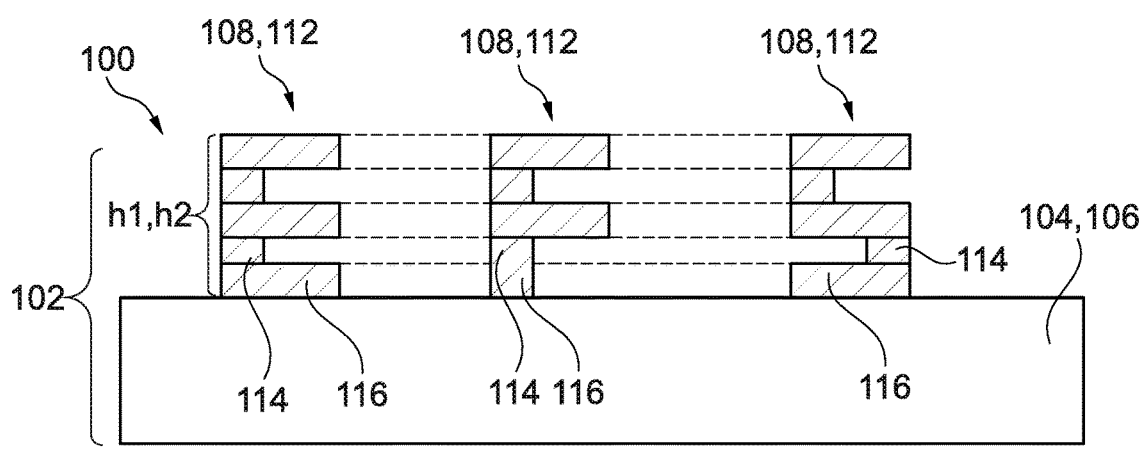

FIG. 16 shows an extension of the formation of various stacked constituents 114, 116, . . . of tracks 108, 112 extending, in the shown embodiment, in five or four interconnected layers. Therefore, it is for instance also possible to form an E-shaped, an F-shaped or an S-shaped track 108, 112.

In some embodiments, it may make sense not to remove the sacrificial layers as described above to prevent air holes due to an incomplete filling of complicated structures. In such an embodiment, the sacrificial layer may be better denoted as structural layer. In this case, a photo-imageable dielectric may be used. This also means that the base layer may be before or a fully additive process is used to create the structure.

Alternatively, also a dielectric comprising a high rate of liquidity or having a low viscosity may be used to fill the gaps.

In yet another embodiment, it is possible to add one or more further layer as surface finish(es). It is also possible that—in difference to the figures—another layer-count is used before carrying out an exemplary embodiment of the invention.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:
1. A component carrier, comprising:
a stack comprising at least one electrically conductive layer structure and/or at least one electrically insulating layer structure;

at least one first electrically conductive track extending from a vertical level defined by one of the layer structures up to a first height;

at least one second electrically conductive track extending from the vertical level defined by the one of the layer structures up to a second height being larger than the first height; and at least one further electrically insulating layer structure in which the at least one first electrically conductive track and the at least one second electrically conductive track are embedded;

wherein the at least one second electrically conductive track is configured for carrying out at least one task from a group consisting of transmitting a higher current than the at least one first electrically conductive track, transmitting higher-frequency signals than the at least one first electrically conductive track, and removing more heat than the at least one first electrically conductive track, wherein the at least one further electrically insulating layer structure comprises or consists of resin without reinforcing fibers or structures.

2. The component carrier according to claim 1,
wherein at least one of the at least one first electrically conductive track and the at least one second electrically conductive track is a multilevel track composed of at least two stacked track constituents, wherein different ones of the at least two stacked track constituents have different lateral extensions and/or different vertical extensions.

3. The component carrier according to claim 2, comprising at least one of the following features:
wherein a lateral extension of an upper one of the at least two stacked track constituents is larger than a lateral extension of a lower one of the at least two stacked track constituents;
wherein a vertical extension of an upper one of the at least two stacked track constituents is larger than a vertical extension of a lower one of the at least two stacked track constituents.

4. The component carrier according to claim 1,
wherein the at least one electrically insulating layer structure comprises resin with reinforcing structures.

5. The component carrier according to claim 1,
wherein the at least one electrically insulating layer structure and the at least one further electrically insulating layer structure are made of the same or from different materials.

6. The component carrier according to claim 1, comprising at least one of the following features:
wherein a cross-section of at least one of the at least one first electrically conductive track and the at least one second electrically conductive track has a shape of one of the group consisting of a rectangle, an L-shape, a horizontally inverted L-shape, a vertically inverted L-shape, a T-shape, a vertically inverted T-shape, a U-shape, a vertically inverted U-shape, an E-shape, an F-shape, an S-shape, a horizontally inverted E-shape, a vertically inverted F-shape, and a vertically inverted S-shape;
wherein the at least one first electrically conductive track and the at least one second electrically conductive track are functionally separated from each other and individually configured so that the at least one first electrically conductive track provides a first function and the at least one second electrically conductive track provides another second function, wherein the first function and the second function are assigned by a corresponding hardware configuration in accordance with the different heights; comprising an undercut at a bottom portion of at least one of the at least one first electrically conductive track and/or at least one of the at least one second electrically conductive track;
wherein at least one of the at least one first electrically conductive track and/or at least one of the at least one second electrically conductive track has a roughness on a horizontal surface portion being different from a roughness on a side surface portion;
wherein at least one of the at least one second electrically conductive track has an aspect ratio of larger than one;
wherein a ratio between the second height and the first height is at least 1.5;
wherein the first height is in a range between 5 μm and 40 μm;
wherein the second height is in a range between 10 μm and 160 μm;
wherein a lateral extension of a respective one of the first electrically conductive traces is larger than the first height;
wherein a lateral extension of a respective one of the second electrically conductive traces is in a range from 50% to 200% of the second height, wherein the lateral extension is substantially the same as the second height;
wherein a plurality of first electrically conductive tracks and a plurality of second electrically conductive tracks are formed on both opposing main surfaces of the stack; comprising at least one component being surface mounted on and/or embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the at least one electrically conductive layer structure and/or at least one of the further electrically conductive layer structure comprises at least one of the group consisting of copper, aluminum, nickel, silver, gold, palladium, and tungsten, any of the mentioned materials being optionally coated with supra-conductive material such as graphene;
wherein at least one of the at least one electrically insulating layer structure and/or at least one of the at least one further electrically insulating layer structure comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
wherein the component carrier is shaped as a plate;
wherein the component carrier is configured as one of the group consisting of a printed circuit board, and a substrate;

wherein the component carrier is configured as a laminate-type component carrier.

7. A method of manufacturing a component carrier, the method comprising:
providing a stack comprising at least one electrically conductive layer structure and/or at least one electrically insulating layer structure;
forming at least one first electrically conductive track extending from a vertical level defined by one of the layer structures up to a first height;
forming at least one second electrically conductive track extending from the vertical level defined by the one of the layer structures up to a second height being larger than the first height; and
embedding the at least one first electrically conductive track and the at least one second electrically conductive track in at least one further electrically insulating layer structure;
wherein the at least one second electrically conductive track is configured for carrying out at least one task from a group consisting of transmitting a higher current than the at least one first electrically conductive track, transmitting higher-frequency signals than the at least one first electrically conductive track, and removing more heat than the at least one first electrically conductive track, wherein the at least one further electrically insulating layer structure comprises or consists of resin without reinforcing fibers or structures.

8. The method according to claim 7, the method further comprising:
forming at least one of the at least one first electrically conductive track and the at least one second electrically conductive track as a multilevel track of at least two stacked track constituents.

9. The method according to claim 8, wherein the multilevel track is formed by:
forming a lower one of the track constituents as a patterned electrically conductive layer structure; and
subsequently forming an upper one of the track constituents stacked on the lower one of the track constituents as a further patterned electrically conductive layer structure.

10. The method according to claim 9,
wherein forming a patterned electrically conductive layer structures is formed by:
forming a patterned sacrificial layer structure having at least one recess;
filling at least one recess of the patterned sacrificial layer structure with electrically conductive material; and
subsequently removing the patterned sacrificial layer structure.

11. The method according to claim 8,
wherein the method comprises forming different ones of the at least two stacked track constituents so as to have different lateral extensions, wherein the method comprises forming an upper one of the at least two stacked track constituents with a larger lateral extension as compared to a smaller lateral extension of a lower one of the at least two stacked track constituents.

12. The method according to claim 7,
wherein the method comprises providing a continuous base layer constituting a bottom portion of the at least one first electrically conductive track and/or the at least one second electrically conductive track.

13. The method according to claim 12,
wherein the method comprises forming the at least one first electrically conductive track by:
forming the continuous base layer by electroless deposition or sputtering or by lamination of an electrically conductive foil; and
forming a patterned sacrificial layer having at least one recess on the continuous base layer exposing at least one portion of the continuous base layer;
at least partially filling electrically conductive material selectively in the at least one recess and on the continuous base layer to thereby obtain the at least one first electrically conductive track.

14. The method according to claim 12,
wherein the method comprises forming a patterned further sacrificial layer on the at least one first electrically conductive track and on the continuous base layer and having at least one recess exposing at least one further portion of the continuous base layer.

15. The method according to claim 14,
wherein the method comprises at least partially filling the at least one further recess with further electrically conductive material on the continuous base layer to thereby form the at least one second electrically conductive track.

16. The method according to claim 15,
wherein the method comprises removing the further sacrificial structure after the filling.

17. The method according to claim 16,
wherein the method comprises, after the removing, remove exposed material of the continuous base layer to thereby separate the at least one first electrically conductive track and the at least one second electrically conductive track from one another.

18. The method according to claim 14, further comprising:
repeating the process flow according to claim 15 N times, wherein N is an integer number of one or larger than one, for obtaining electrically conductive tracks of N+2 different heights.

19. The method according to claim 7,
wherein the method comprises forming the at least one first electrically conductive track and a part of the at least one second electrically conductive track simultaneously.

\* \* \* \* \*